US008643539B2

(12) United States Patent
Pauly et al.

(10) Patent No.: US 8,643,539 B2
(45) Date of Patent: Feb. 4, 2014

(54) ADVANCE MANUFACTURING MONITORING AND DIAGNOSTIC TOOL

(75) Inventors: Gerald William Pauly, Houston, PA (US); Walter John Keller, III, Bridgeville, PA (US)

(73) Assignee: Nokomis, Inc., Charleroi, PA (US)

( * ) Notice: Subject to any disclaimer, the term of this patent is extended or adjusted under 35 U.S.C. 154(b) by 572 days.

(21) Appl. No.: 12/551,635

(22) Filed: Sep. 1, 2009

(65) Prior Publication Data

US 2010/0123453 A1     May 20, 2010

Related U.S. Application Data

(60) Provisional application No. 61/199,650, filed on Nov. 19, 2008.

(51) Int. Cl.
| | |
|---|---|
| G01S 7/40 | (2006.01) |
| G01S 13/00 | (2006.01) |
| G21C 17/00 | (2006.01) |
| G01N 37/00 | (2006.01) |
| G01R 31/00 | (2006.01) |
| G01R 31/02 | (2006.01) |
| G01R 31/04 | (2006.01) |
| G01R 31/302 | (2006.01) |
| G01R 31/265 | (2006.01) |

(52) U.S. Cl.
USPC .............. 342/173; 342/165; 342/175; 702/81; 702/182; 702/183; 324/500; 324/501; 324/537; 324/538; 324/762.01

(58) Field of Classification Search
USPC ........... 342/13–20, 22, 89, 90, 128, 129, 165, 342/169–175, 95; 340/572.2; 324/537, 324/750.01, 754.01, 754.06, 754.21, 324/754.31, 762.01, 763.01, 500, 501, 538, 324/600, 601, 637–639, 158.1, 750.02, 324/762.02; 700/174, 175; 702/34, 702/117–120, 182–185
See application file for complete search history.

(56) References Cited

U.S. PATENT DOCUMENTS

| | | | | | |
|---|---|---|---|---|---|
| 4,058,804 | A | * | 11/1977 | Sawada et al. | 340/635 |
| 4,351,029 | A | * | 9/1982 | Maxey et al. | 702/34 |
| 4,442,494 | A | * | 4/1984 | Fromson et al. | 702/34 |
| 4,658,245 | A | * | 4/1987 | Dye et al. | 340/683 |
| 5,006,788 | A | * | 4/1991 | Goulette et al. | 324/95 |
| 5,028,866 | A | * | 7/1991 | Wiese | 324/763.01 |
| 5,126,677 | A | * | 6/1992 | Campbell et al. | 324/511 |
| 5,218,294 | A | * | 6/1993 | Soiferman | 324/763.01 |
| 5,227,800 | A | * | 7/1993 | Huguenin et al. | 342/179 |
| 5,251,144 | A | * | 10/1993 | Ramamurthi | 700/177 |
| 5,270,222 | A | * | 12/1993 | Moslehi | 438/7 |
| 5,293,216 | A | * | 3/1994 | Moslehi | 356/600 |
| 5,302,830 | A | * | 4/1994 | Shivanandan | 250/342 |
| 5,406,209 | A | * | 4/1995 | Johnson et al. | 324/750.3 |
| 5,417,494 | A | * | 5/1995 | Kempa et al. | 374/5 |

(Continued)

Primary Examiner — Jack W Keith
Assistant Examiner — Peter Bythrow
(74) Attorney, Agent, or Firm — James Ray & Assoc

(57) ABSTRACT

The current invention relates to a monitoring and analysis device and a method for monitoring and analysis that utilizes the unintended electromagnetic emissions of electrically powered systems. The present invention monitors electrical devices by taking detailed measurements of the electromagnetic fields emitted by any component or system utilizing electricity. The measurements will be analyzed to both record a baseline score for future measurements and to be used in detailed analysis to determine the status of the analyzed system or component.

13 Claims, 3 Drawing Sheets

23)

24)

25)

Possible Utilization

(56) References Cited

U.S. PATENT DOCUMENTS

| | | | |
|---|---|---|---|
| 5,424,633 A * | 6/1995 | Soiferman | 324/754.21 |
| 5,428,556 A * | 6/1995 | Torizawa et al. | 702/34 |
| 5,517,110 A * | 5/1996 | Soiferman | 324/750.22 |
| 5,539,325 A * | 7/1996 | Rostoker et al. | 324/750.05 |
| 5,631,572 A * | 5/1997 | Sheen et al. | 324/754.08 |
| 5,668,342 A * | 9/1997 | Discher | 86/50 |
| 5,714,888 A * | 2/1998 | Naujoks | 324/754.31 |
| 5,719,495 A * | 2/1998 | Moslehi | 356/630 |
| 5,798,577 A * | 8/1998 | Lesesky et al. | 307/10.7 |
| 5,854,994 A * | 12/1998 | Canada et al. | 702/56 |
| 5,859,596 A * | 1/1999 | McRae | 340/870.02 |
| 5,900,618 A * | 5/1999 | Anlage et al. | 250/201.3 |
| 5,907,491 A * | 5/1999 | Canada et al. | 700/108 |
| 5,942,991 A * | 8/1999 | Gaudreau et al. | 340/870.16 |
| 6,049,301 A * | 4/2000 | Weagant | 342/13 |
| 6,057,765 A * | 5/2000 | Jones et al. | 340/572.2 |
| 6,118,279 A * | 9/2000 | Field et al. | 324/529 |
| 6,124,725 A * | 9/2000 | Sato | 324/754.03 |
| 6,150,793 A * | 11/2000 | Lesesky et al. | 320/104 |
| 6,150,809 A * | 11/2000 | Tiernan et al. | 324/238 |
| 6,163,259 A * | 12/2000 | Barsumian et al. | 340/572.2 |
| 6,236,223 B1 * | 5/2001 | Brady et al. | 324/750.3 |
| 6,281,697 B1 * | 8/2001 | Masuda et al. | 324/754.29 |
| 6,324,486 B1 * | 11/2001 | Crook et al. | 702/117 |
| 6,331,782 B1 * | 12/2001 | White et al. | 324/754.23 |
| 6,363,332 B1 * | 3/2002 | Rangarajan et al. | 702/185 |
| 6,455,766 B1 * | 9/2002 | Cook et al. | 136/244 |
| 6,456,070 B1 * | 9/2002 | Kazama et al. | 324/260 |
| 6,466,882 B1 * | 10/2002 | Kang et al. | 702/84 |
| 6,489,884 B1 * | 12/2002 | Lamberson et al. | 340/7.2 |
| 6,496,703 B1 * | 12/2002 | da Silva | 455/456.4 |
| 6,612,172 B2 * | 9/2003 | Cadet et al. | 73/587 |
| 6,759,850 B2 * | 7/2004 | Harzanu et al. | 324/522 |
| 6,759,863 B2 * | 7/2004 | Moore | 324/762.03 |
| 6,759,864 B2 * | 7/2004 | Patel | 324/762.02 |
| 6,765,527 B2 * | 7/2004 | Jablonski et al. | 342/193 |
| 6,879,167 B2 * | 4/2005 | Ju et al. | 324/642 |
| 6,897,777 B2 * | 5/2005 | Holmes et al. | 340/572.2 |
| 6,927,579 B2 * | 8/2005 | Blades | 324/536 |
| 6,940,295 B2 * | 9/2005 | Engelbart et al. | 324/700 |
| 6,947,800 B2 * | 9/2005 | Flanagan et al. | 700/108 |
| 6,970,762 B1 * | 11/2005 | Elliott et al. | 700/174 |
| 7,010,386 B2 * | 3/2006 | McDonnell et al. | 700/175 |
| 7,034,660 B2 * | 4/2006 | Watters et al. | 340/10.41 |
| 7,039,491 B1 * | 5/2006 | Delbrugge et al. | 700/174 |
| 7,086,593 B2 * | 8/2006 | Woodard et al. | 235/449 |
| 7,103,460 B1 * | 9/2006 | Breed | 701/32.9 |
| 7,130,624 B1 * | 10/2006 | Jackson et al. | 455/420 |
| 7,138,936 B2 * | 11/2006 | Duff et al. | 342/14 |
| 7,145,356 B2 * | 12/2006 | Sang Gi | 324/762.09 |
| 7,145,453 B2 * | 12/2006 | Miller et al. | 340/539.26 |
| 7,188,037 B2 * | 3/2007 | Hidehira | 702/58 |
| 7,218,093 B2 * | 5/2007 | Cirkel et al. | 324/750.01 |
| 7,220,990 B2 * | 5/2007 | Aghababazadeh et al. | 257/48 |
| 7,250,781 B2 * | 7/2007 | Nakagawa et al. | 324/756.05 |
| 7,250,785 B2 * | 7/2007 | Kawaike et al. | 324/754.29 |
| 7,256,055 B2 * | 8/2007 | Aghababazadeh et al. | 438/11 |
| 7,289,873 B2 * | 10/2007 | Redecker et al. | 700/174 |
| 7,328,126 B2 * | 2/2008 | Chamness | 702/182 |
| 7,355,417 B1 * | 4/2008 | Shusterman et al. | 324/754.21 |
| 7,397,421 B2 * | 7/2008 | Smith | 342/192 |
| 7,424,338 B1 * | 9/2008 | Wipert | 700/175 |
| 7,466,157 B2 * | 12/2008 | Miller | 324/750.3 |
| 7,492,303 B1 * | 2/2009 | Levitan et al. | 342/22 |
| 7,512,511 B1 * | 3/2009 | Schultz et al. | 702/127 |
| 7,515,094 B2 * | 4/2009 | Keller, III | 342/90 |
| 7,554,352 B2 * | 6/2009 | Huie | 324/762.02 |
| 7,609,199 B2 * | 10/2009 | Nishijima et al. | 342/175 |
| 7,639,178 B1 * | 12/2009 | Mulbrook et al. | 342/146 |
| 7,710,287 B2 * | 5/2010 | Lange et al. | 340/680 |
| 7,777,671 B2 * | 8/2010 | Schnitzer et al. | 342/193 |
| 7,777,672 B2 * | 8/2010 | Schnitzer et al. | 342/193 |
| 7,902,834 B2 * | 3/2011 | Wolfe et al. | 324/555 |
| 7,956,617 B1 * | 6/2011 | McCarthy et al. | 324/537 |
| 8,028,208 B2 * | 9/2011 | Moore | 714/724 |
| 8,103,463 B2 * | 1/2012 | Kalgren et al. | 702/57 |
| 8,344,745 B2 * | 1/2013 | Aghababazadeh et al. | 324/750.3 |
| 8,390,307 B2 * | 3/2013 | Slupsky et al. | 324/754.31 |
| 2001/0011903 A1 * | 8/2001 | O'Neill et al. | 324/763 |
| 2001/0056340 A1 * | 12/2001 | Gorin et al. | 703/14 |
| 2002/0011852 A1 * | 1/2002 | Mandelis et al. | 324/752 |
| 2002/0024432 A1 * | 2/2002 | Lin et al. | 340/442 |
| 2002/0121915 A1 * | 9/2002 | Alonso Montull | 324/765 |
| 2003/0001596 A1 * | 1/2003 | Suga et al. | 324/750 |
| 2003/0034444 A1 * | 2/2003 | Chadwick et al. | 250/225 |
| 2003/0155927 A1 * | 8/2003 | Pinto et al. | 324/501 |
| 2003/0179126 A1 * | 9/2003 | Jablonski et al. | 342/22 |
| 2004/0041724 A1 * | 3/2004 | Levitan et al. | 342/22 |
| 2004/0095243 A1 * | 5/2004 | Holmes et al. | 340/572.2 |
| 2004/0100280 A1 * | 5/2004 | Ju et al. | 324/642 |
| 2005/0265124 A1 * | 12/2005 | Smith | 367/128 |
| 2006/0082488 A1 * | 4/2006 | Keller, III | 342/22 |
| 2006/0152232 A1 * | 7/2006 | Shvets et al. | 324/750 |
| 2007/0013577 A1 * | 1/2007 | Schnitzer et al. | 342/90 |
| 2007/0027643 A1 * | 2/2007 | Lesesky et al. | 702/60 |
| 2007/0046298 A1 * | 3/2007 | Safai et al. | 324/639 |
| 2007/0063886 A1 * | 3/2007 | Brumley et al. | 342/13 |
| 2007/0120571 A1 * | 5/2007 | Huie | 324/512 |
| 2007/0213951 A1 * | 9/2007 | Van Eeden | 702/116 |
| 2007/0279071 A1 * | 12/2007 | Orton | 324/523 |
| 2007/0282541 A1 * | 12/2007 | Griess et al. | 702/34 |
| 2008/0141072 A1 * | 6/2008 | Kalgren et al. | 714/33 |
| 2008/0169968 A1 * | 7/2008 | Easthope et al. | 342/95 |
| 2008/0177486 A1 * | 7/2008 | Farkas | 702/59 |
| 2008/0204275 A1 * | 8/2008 | Wavering et al. | 340/870.16 |
| 2009/0243924 A1 * | 10/2009 | Twitchell et al. | 342/357.07 |
| 2010/0097269 A1 * | 4/2010 | Loidl et al. | 342/378 |
| 2010/0123453 A1 * | 5/2010 | Pauly et al. | 324/76.11 |
| 2010/0125438 A1 * | 5/2010 | Audet | 702/189 |

\* cited by examiner

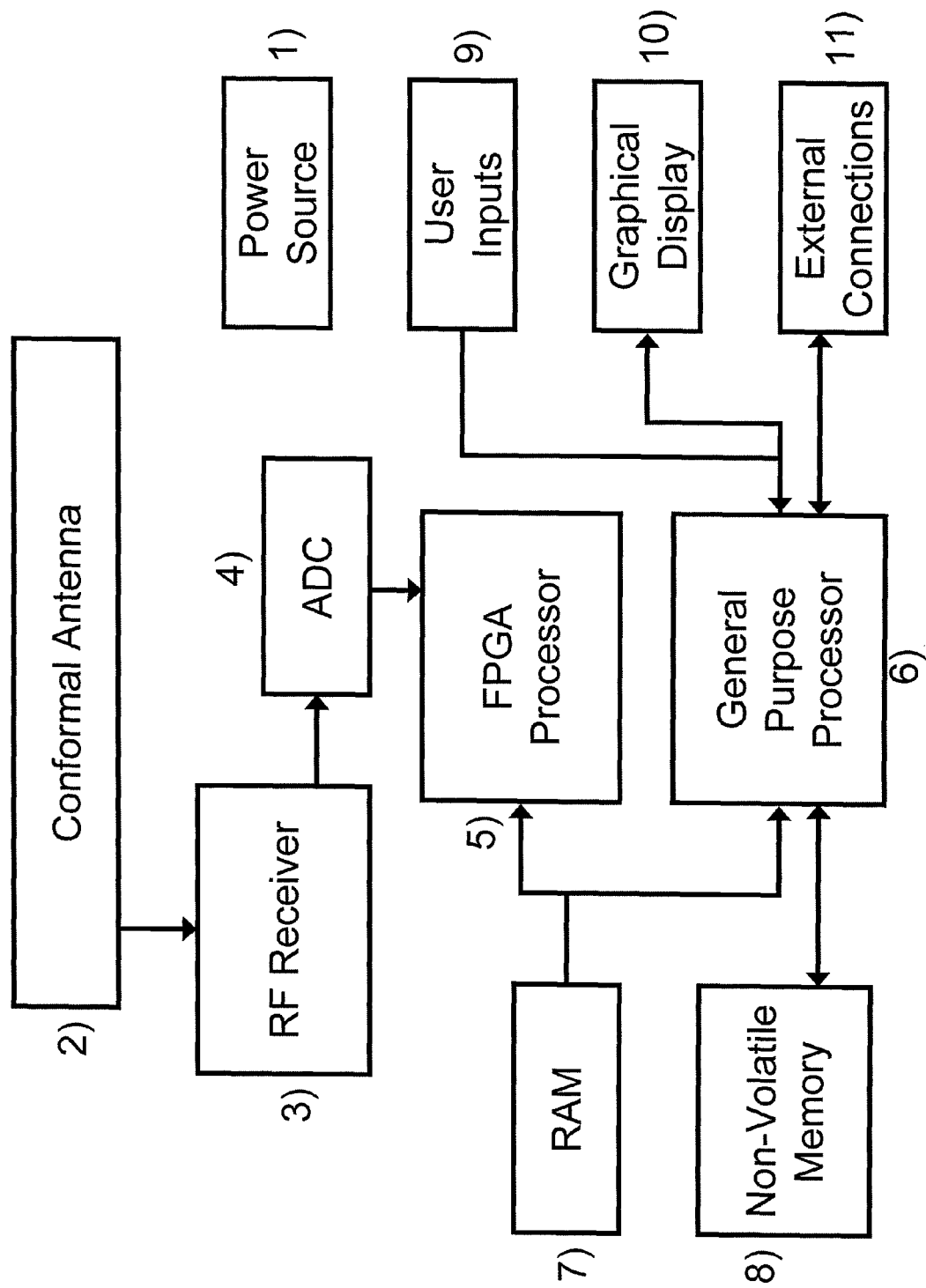
Figure 1: Possible Implementation

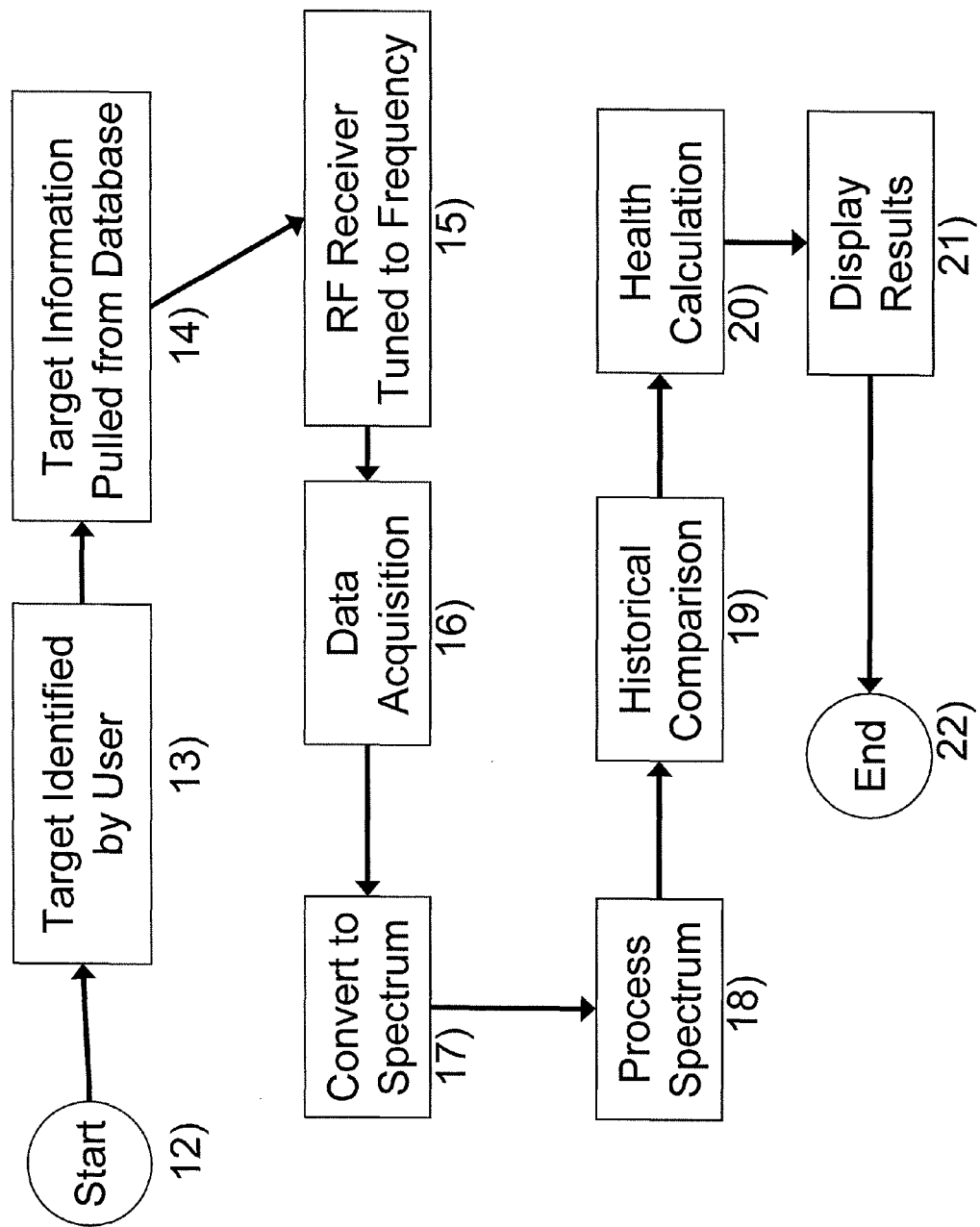
Figure 2: Processing Flow Chart

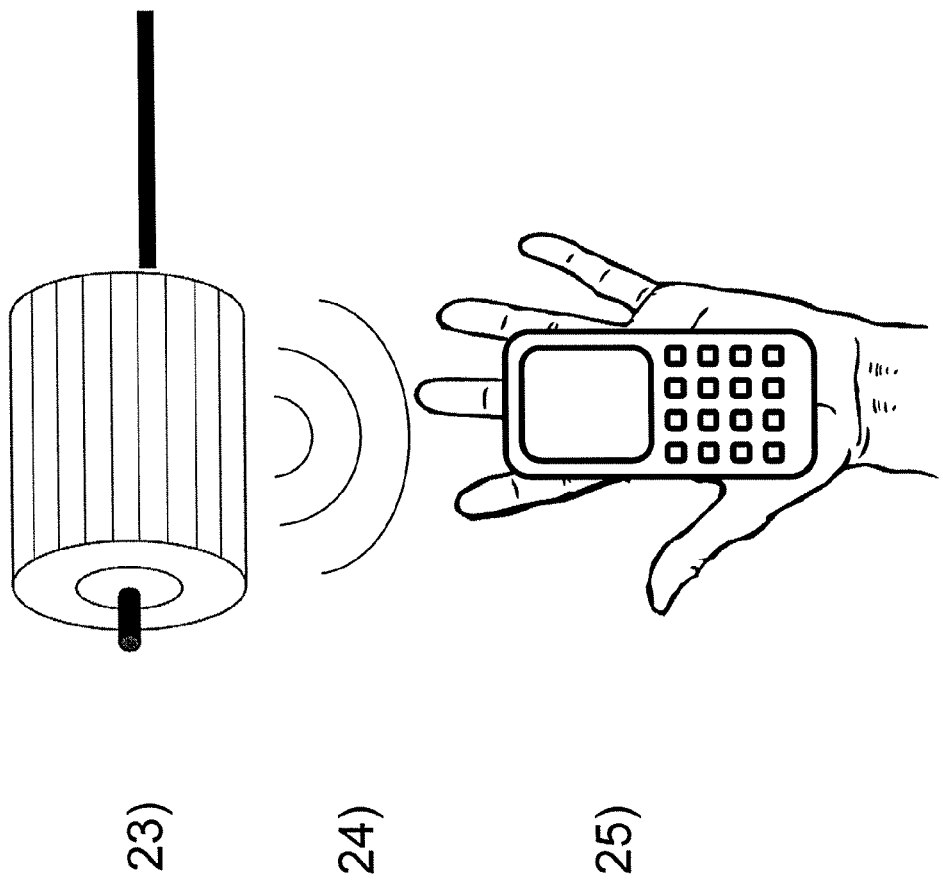
Figure 3: Possible Utilization
23)
24)
25)

ADVANCE MANUFACTURING MONITORING AND DIAGNOSTIC TOOL

CROSS REFERENCE TO RELATED APPLICATION

This patent application is related to and claims priority from U.S. Provisional Patent Application Ser. No. 61/199,650 filed Nov. 19, 2008 and is herein incorporated by reference.

FIELD OF THE INVENTION

The present invention relates, in general, to the monitoring and diagnosis of electrical devices by measuring electromagnetic emissions and, more particularly, this invention relates to a monitoring and analysis device and a method for monitoring and analysis that utilizes the unintended electromagnetic emissions of electrically powered systems.

BACKGROUND OF THE INVENTION

Many of the concepts of the present invention are outlined in U.S. Pat. No. 7,515,094 and U.S. patent application Ser. No. 12/422,646 and are herein incorporated by reference.

The current invention relates to the field of electromagnetic emissions of electrically powered systems. Specifically it relates to systems or components of systems that require electrical power to operate. The function of these systems or components can be motive, thermal generation, or processing and control modules. All of these systems make use of electricity and exhibit wear that degrades their performance over time and can lead to system or component failure.

SUMMARY OF THE INVENTION

The present invention is a monitoring and analysis device that utilizes the unintended emissions of electrically powered systems. The certain embodiments of the invention can be completely automated and non-invasive to the device being analyzed.

The present invention monitors electrical devices by taking detailed measurements of the electromagnetic fields emitted by any component or system utilizing electricity. The measurements will be analyzed to both record a baseline score for future measurements and to be used in detailed analysis to determine the status of the analyzed system or component.

The use of electrical energy generates electromagnetic fields in accordance with many known electrical and electromagnetic physical laws. Detailed measurements can detect specific emitted differences between similar components and discern component status and degradation. Generated field characteristics can also be changed by the operational mode and characteristics of an electrical device being measured.

Utilizing an antenna, a radio-frequency tuner, and integrated processing components the spectrum of the target device is monitored and analyzed to diagnose problems and potential failure of the target device.

In more detail, an advantage of the present invention is the ability to monitor and diagnose electrical equipment without any alterations or physical connections to the device being monitored. The present invention allows for the automated and remote monitoring of any electrically powered device.

The advantages of the present inventions include, without limitation, the ability to monitor and analyze electronics without the need to disassemble the target, to physically attach monitoring equipment, or to employ specially designed equipment throughout a factory or other manufacturing environment. The device outlined in this would be easier to employ than current methods while providing a greater breadth of information.

Electrical components and systems are found in numerous implementations throughout every industry. Current methods of maintenance and repair for these devices involve laborious testing using physical access to the device of interest. Such access is not in the best interest of the users of these systems and components.

Systems must be shut down to safely access high power components but certain problems may not manifest in a powered down state. In addition, the time required to inspect said devices and to keep the system disabled for inspection is highly costly.

The present invention provides a method of monitoring and diagnosing problems with complex electrical systems without the need to interfere with the operation of these systems or components. Operations can continue, saving money and time that would be diverted to maintenance. In addition, the present invention will provide greater data than previously possessed allowing system failures to be prevented, saving additional time and money.

In more detail, the present invention is capable of detecting and analyzing the unintended electromagnetic signature produced by any device employing electricity for power. The electromagnetic emissions of an electrically powered device vary depending on the health and status of the internal components of the device being monitored. The device outlined in this patent utilizes these unintended electromagnetic emissions to determine the health of a specific electrical device.

OBJECTS OF THE INVENTION

It is, therefore, one of the primary objects of the present invention to provide a system to diagnose and monitor electrically powered systems and components by measuring the unintended radiated electromagnetic characteristics emitted from said electrically powered systems and components.

It is another object of the present invention to provide a diagnostic tool to assess the health of electrically powered support operations and equipment in a manufacturing environment.

It is another object of the present invention to provide a diagnostic tool to assess the health of electrically powered support operations and equipment in a non-manufacturing environment.

It is another object of the present invention to provide a diagnostic tool to assess the performance of products of a manufacturing line.

It is another object of the present invention to provide a quality assurance tool during the manufacturing process.

It is another object of the present invention to provide a diagnostic tool to assess the health of electrically powered manufacturing equipment and tools.

It is another object of the present invention to provide a diagnostic tool to assess the health of electrically powered manufacturing processes.

It is another object of the present invention to provide a means of significantly decrease the costs associated with manufacturing processes.

It is another object of the present invention to provide a means of significantly decrease the costs associated with manufacturing maintenance processes.

It is another object of the present invention to provide an improved troubleshooting capability for manufacturing processes._

It is another object of the present invention to provide a diagnostic tool to assess the health of electrically powered manufacturing equipment.

It is another object of the present invention to significantly decrease costs associated with manufacturing equipment.

It is another object of the present invention to significantly decrease costs associated with manufacturing maintenance equipment.

It is another object of the present invention to provide trouble shooting capability for manufacturing equipment.

It is another object of the present invention to provide a preventative maintenance capability to limit unanticipated down time.

It is another object of the present invention to allow measurements to be taken without any modifications of the targeted equipment.

It is another object of the present invention to provide a mobile and readily reconfigurable diagnostic tool for a variety of equipment diagnostic tasks.

It is another object of the present invention to provide a diagnostic tool that allows operation by a user without any advanced training or education in the theory of electromagnetism to be effective.

It is another object of the present invention to provide either narrow band or wide band spectrum analysis of the equipment undergoing analysis.

It is another object of the present invention to provide a diagnostic tool that can be used to determine equipment that needs periodic maintenance whether the anticipated lifespan of the equipment has elapsed or not.

It is another object of the present invention to provide a diagnostic tool that can be used to determine if equipment can remain in service beyond the anticipated lifespan due to the continued good health of the device.

It is another object of the present invention to provide a diagnostic tool that it be used to diagnose manufacturing inconsistencies on a board level.

It is another object of the present invention to provide a diagnostic tool that can be used for quality control during semiconductor manufacturing.

It is another object of the present invention to provide a diagnostic tool that it is comprised of additional processing assets to enhance diagnosis of manufacturing processes.

It is another object of the present invention to provide a diagnostic tool that uses conformal antenna technology to enhance diagnostics of manufacturing processes.

It is another object of the present invention to provide a diagnostic tool that uses advanced software tools to enhance diagnostics of manufacturing processes.

It is another object of the present invention to provide a diagnostic tool that uses a sensitive radio frequency receiver that functions in the microwave frequency band for diagnostics of manufacturing processes using free field emissions from the equipment being tested.

It is another object of the present invention to provide a diagnostic tool that is comprised of a sensitive receiver that functions in the electromagnetic frequency bands below 1 MHz for the diagnosis of manufacturing processes using free field emissions from the equipment being tested.

It is another object of the present invention to provide a diagnostic tool that is comprised of a sensitive receiver that functions in the electromagnetic frequency bands above 1 MHz for the diagnosis of manufacturing processes using free field emissions from the equipment being tested.

It is another object of the present invention to provide a diagnostic tool enhanced by the inclusion of ultra sensitive front end receivers.

It is another object of the present invention to provide a diagnostic tool enhanced by the inclusion of Field Programmable Gate Array (FPGA) based processing assets.

It is another object of the present invention to provide a diagnostic tool enhanced by the inclusion of a detailed manufacturing equipment emissions signature database.

It is another object of the present invention to provide a diagnostic tool enhanced by the inclusion of robust signature detection software.

It is another object of the present invention to provide a diagnostic tool enhanced by the use of external computational assets.

It is another object of the present invention to provide a diagnostic tool enhanced by a direct connection to the targeted electronic equipment.

It is another object of the present invention to provide a diagnostic tool enhanced by the inclusion of thermal data of the targeted electronic equipment.

It is another object of the present invention to provide a diagnostic tool enhanced by the inclusion of visual data of the targeted electronic equipment.

It is another object of the present invention to provide a diagnostic tool enhanced by the inclusion of an active electromagnetic illumination of the targeted electronic equipment.

It is another object of the present invention to provide a diagnostic tool enhanced by the inclusion of X-Ray data of the targeted electronic equipment.

It is another object of the present invention to provide a diagnostic tool enhanced by the inclusion of physical dimension data of the targeted electronic equipment.

It is another object of the present invention to provide a diagnostic tool enhanced by the inclusion of sonic data of the targeted electronic equipment.

It is another object of the present invention to provide a method for the monitoring and analysis of the health of electrical motors.

It is another object of the present invention to provide a method for the monitoring and analysis of the health of electrical controls.

It is another object of the present invention to provide a method for the monitoring and analysis of the health of implanted medical devices.

It is another object of the present invention to provide a method for the monitoring and analysis of the health of robotic technologies.

It is another object of the present invention to provide a method for the monitoring and analysis of the health of electronic sensors.

It is another object of the present invention to provide a method for the monitoring and analysis of the health of Radio Frequency Identification (RFID) devices.

It is another object of the present invention to provide a method for the monitoring and analysis of the health of radios and other electromagnetic communication devices.

It is another object of the present invention to provide a method for the monitoring and analysis of the health of automotive electrical systems.

It is another object of the present invention to provide a method for the monitoring and analysis of the health of aerospace electrical systems during normal operations of the aerospace vehicle.

It is another object of the present invention to provide a method for the monitoring and analysis of the health of any ground based electrical systems that employ electronics.

It is another object of the present invention to provide a method for the monitoring and analysis of the health of battery chargers.

It is another object of the present invention to provide a method for the monitoring and analysis of the health of electrical ignition systems.

It is another object of the present invention to provide a method for the monitoring and analysis of the health of electrical servo-motors.

It is another object of the present invention to provide a method for the monitoring and analysis of the health of electrical solenoids and valves.

It is another object of the present invention to provide a method for the monitoring and analysis of the health of generators and alternators.

It is another object of the present invention to provide a method for the monitoring and analysis of the health of transformers and electrical switching systems.

It is another object of the present invention to provide a method for the monitoring and analysis of the health of computers and other processing equipment.

It is another object of the present invention to provide a method for the monitoring and analysis of the health of microcontrollers.

It is another object of the present invention to provide a method for the monitoring and analysis of the health of microprocessors.

It is another object of the present invention to provide a method for the monitoring and analysis of the health of electrical monitoring and diagnosis devices.

In one embodiment the invention is an electromagnetic emission measurement device comprising: an antenna, a receiver, at least one processor, wherein said electromagnetic emission measurement device is configured to monitor at least one electrical device by measuring at least one electromagnetic emission given off by said at least one electrical device. In another embodiment the electromagnetic emission measurement device comprises an analog to digital converter. In another embodiment the electromagnetic emission measurement device comprises of an integrated receiver and processor. In another embodiment the electromagnetic emission measurement device further comprises of an active illumination transmitter. In yet another embodiment the electromagnetic emission measurement device is configured to monitor the health of said electrical device. In still another embodiment the electromagnetic emission measurement device is configured to diagnose defects in said electrical device. In yet still another embodiment the electromagnetic emission measurement device is used to predict the degradation a component of said electrical device. In still yet another embodiment the electromagnetic emission measurement device is used to predict the degradation of said electrical device. In yet another embodiment the electromagnetic emission measurement device operates in real time to assess the health of said electrical device. In still another embodiment the electromagnetic emission measurement device is used in stand-alone measurements to assess in real-time said electrical device's health. In yet another embodiment the electromagnetic emission measurement device is configured to assess the health of an electronic system. In still another embodiment the electromagnetic emission measurement device is configured to focus on a specified component and subcomponent. In another embodiment the electromagnetic emission measurement device is configured to measure said at least one electromagnetic emission for an extended period of time in at least two periodic measurements. In another embodiment the electromagnetic emission measurement device is configured to assess changes in an electromagnetic signature over time. In yet another embodiment the electromagnetic emission measurement device is a diagnostic tool, wherein the receiver is configured to monitor frequency bands above microwave frequencies. In still another embodiment the electromagnetic emission measurement device is configured to measure, analyze and identify signature characteristics of said at least one electrical device for measurement, analysis and diagnosis of a condition of said at least one electrical device. In yet still another embodiment said at least one electrical device comprises an electric motor. In still another embodiment said at least one electrical device comprises a transformer. In another embodiment said at least one electrical device comprises a solenoid. In yet another embodiment said at least one electrical device comprises an engine ignition mechanism. In another embodiment said at least one electrical device comprises a propane powered device. In still another embodiment said at least one electrical device comprises a gasoline powered device. In still another embodiment said at least one electrical device comprises a transistor based device. In yet another embodiment said at least one electrical device comprises a microprocessor. In yet another embodiment said at least one electrical device comprises a microcontroller. In still another embodiment said at least one electrical device comprises a sensor. In yet another embodiment said at least one electrical device comprises a device that transmits electromagnetic energy. In another embodiment said at least one electrical device comprises a device that receives electromagnetic energy. In yet another embodiment said at least one electrical device provides electronic controls. In another embodiment said at least one electrical device comprises an electronic control mechanism for automated manufacturing activities. In still another embodiment said electromagnetic emission measurement device is used to monitor an RFID system. In yet still another embodiment said at least one electrical device comprises functions in an RFID system. In yet another embodiment the electromagnetic emission measurement device is configured to provide intermittent health monitoring of manufacturing equipment to facilitate efficient maintenance. In still another embodiment the electromagnetic emission measurement device is configured to provide continuous health monitoring of manufacturing equipment to facilitate efficient maintenance. In yet another embodiment the electromagnetic emission measurement device is mobile and monitors electrical or electronic manufacturing equipment. In still another embodiment the electromagnetic emission measurement device is configured as a permanently fixed device to monitor specific electrical or electronic manufacturing equipment. In yet another embodiment the electromagnetic emission measurement device is used for quality control related to products developed in a manufacturing facility. In another embodiment the electromagnetic emission measurement device is used for quality control of materials to be incorporated into a manufactured product. In still another embodiment the electromagnetic emission measurement device is used to assure that all subcomponents and subassemblies for construction into a manufactured product are correctly identified. In yet another embodiment the electromagnetic emission measurement device is used to assure that all subcomponents and subassemblies constructed into a manufactured product are correctly assembled. In another embodiment the electromagnetic emission measurement device is used for quality control to identify improperly constructed products.

In another embodiment the invention is a method for monitoring at least one electrical component, said method comprising the steps of: providing a receiver for measuring a electromagnetic emissions signature; providing a database of electromagnetic emission signatures; and comparing said electromagnetic emission signature to said database of electromagnetic emission signatures to determine a status for said at least one predetermined electrical component.

In addition to the various objects and advantages of the present invention described with some degree of specificity above it should be obvious that additional objects and advantages of the present invention will become more readily apparent to those persons who are skilled in the relevant art from the following more detailed description of the invention, particularly, when such description is taken in conjunction with the attached drawing figures and with the appended claims.

BRIEF DESCRIPTION OF THE DRAWINGS

FIG. 1 is a diagram of an example embodiment of the components utilized in the present invention.

FIG. 2 is a diagram of an example embodiment of the functionality of the present invention.

FIG. 3 is a diagram of an example embodiment of the invention is use.

BRIEF DESCRIPTION OF A PRESENTLY PREFERRED AND VARIOUS ALTERNATIVE EMBODIMENTS OF THE INVENTION

Prior to proceeding to the more detailed description of the present invention it should be noted that, for the sake of clarity and understanding, identical components which have identical functions have been identified with identical reference numerals throughout the several views illustrated in the drawing figures.

Reference is now made, more particularly, to FIG. 1 of the drawings which provides a diagram of the components that could be utilized in the present invention. Power source 1 provides sufficient electrical power for all components. Power source 1 could be an external power supply, but preferably is an internal battery. Conformal antenna 2 is tuned to the appropriate frequencies and should be designed to fit within the confines of the device. RF receiver 3 receives a raw signal from conformal antenna 2, extracts the desired target frequency or frequencies, and retransmits the target signal at a reference frequency. Analog-to-digital converter (ADC) 4 converts the signal or signals from analog to digital format for use by the Field Programmable Gate Array (FPGA) 5.

FPGA 5 is a semiconductor device that can be configured to perform the actions and functions of an application-specific integrated circuit (ASIC) or the like. FPGA 5 will conduct initial processing of the targeted analog signal, including converting it to a baseband frequency. Such conversion to a baseband frequency could be accomplished by using a cascade integrated comb (CIC) filter to decimate the data, and apply a Fast Fourier Transform (FFT) to transition to the signal to a frequency domain. Other methods cold be employed instead or in addition to CIC and FFT, which could include wavelet transforms, or other similar methods known in the art. General purpose processor (GPU) 6 could perform higher level processing on the signal including comparing the signal to the predetermined signature, accessing non-volatile memory to store historical records, and interface with a user. Random access memory (RAM) 7 could be used by both GPU 6 and FPGA 5 for short term data storage. Non-volatile memory 8 could consist of a long term stable memory that will store details and measurement between power off states of the device. User inputs 9 could consist of several buttons on the device that will allow the user to select the target to be measured and the type of measurement to conduct. Graphical display 10 could show the user the status of the device and the results of any test conducted. The user inputs 9 and graphical display 10 could be incorporated together to form a graphical user interface, which could be in the form of a touch screen interface. External connections 11 could consist of any means to allow the data of the device to be downloaded to an outside computer for both reports and further analysis.

Reference is now made to FIG. 2 which is a diagram of an example embodiment of the functionality of the present invention. At Start 12 a new target electronic device will be detected by the present invention. At target identified by user 13, a user identifies the desired target to the Advanced Manufacturing Monitoring and Diagnosis Tool embodying the present invention, either selecting one from memory that has been inspected before or by selecting a new target. This step may include identifying the type of device being monitored. At target information pulled from database 14, Information about past measurements of the electrically powered target and about the anticipated reading is recovered from non-volatile memory 8. at RF receiver tuned to frequency 15, the system is prepared by setting the RF Receiver for the appropriate frequencies for the specified target. At data acquisition 16, the RF Receiver 3, ADC 4, and FPGA 5 acquire data from the Conformal Antenna 2, producing a digital waveform of the emitted spectrum from the targeted component, device or system. At convert spectrum 17, FPGA 5 performs initial processing of the signature by performing a CIC filter and an FFT to transform the waveform to the frequency domain of interest. At process spectrum 18, the FPGA 5 and the GPU 6 process the frequency domain to identify inconsistencies in the measured waveform from the anticipated waveform. At historical comparison 19, the GPU 6 compares the measurements to historical measurements of the target device to identify any trends towards the deterioration or failure of the targeted device. At health calculation 20, the GPU 6 could then weight the results of the processes to give a total health assessment of the targeted device. At display results 21, the health assessment and any associated data requested are provided to the user by means of the graphical display, logging into a file, or the like. At end 22, The process of monitoring and diagnosing this target is completed and the invention could be reset to start 12.

Reference is now made to FIG. 3 a diagram of an example embodiment of the present invention is use. Electrical device 23 emits EM radiation 24 which is detected and measured by Advance Manufacturing Monitoring and Diagnostic Tool 25 shown as a hand held device. In practice Advance Manufacturing Monitoring and Diagnostic Tool 25 would be carried by a user in a manufacturing facility or other environment where such monitoring would be beneficial, so that user could quickly inspect the health of various electrical components, devices and systems.

While a presently preferred and various alternative embodiments of the present invention have been described in sufficient detail above to enable a person skilled in the relevant art to make and use the same it should be obvious that various other adaptations and modifications can be envisioned by those persons skilled in such art without departing from either the spirit of the invention or the scope of the appended claims.

We claim:
1. A device comprising:
an antenna, a receiver, configured, in combination with said antenna, to receive at least one emission of an electromagnetic energy, said at least one emission being given off by at least one electrical device;

at least one processor;

wherein said device is configured to monitor the at least one electrical device by measuring and processing a change or changes in a signature of said at least one electromagnetic emission; and wherein said device is configured to predict degradation of a component of the at least one electrical device based on said signature change or changes.

2. A device comprising:

an antenna, a receiver, configured, in combination with said antenna, to receive at least one emission of an electromagnetic energy, said at least one emission being given off by at least one electrical device;

at least one processor;

wherein said device is configured to monitor the at least one electrical device by measuring and processing a change or changes in a signature of said at least one electromagnetic emission; and wherein the electromagnetic emission measurement device is configured, based on said signature changes, to predict degradation of the at least one electrical device.

3. A comprising:

an antenna, a receiver, configured, in combination with said antenna, to receive at least one unintended emission of an electromagnetic energy, said at least one unintended emission being given off by at least one semiconductor device;

at least one processor;

wherein said device is configured to passively measure and process a change or changes in a signature of said at least one unintended electromagnetic emission and is further configured to assess at least one of a health, defects, inconsistency and degradation of the at least one semiconductor device either during manufacturing of the at least one semiconductor device, during manufacturing of an assembly containing the at least one semiconductor device or during a quality control inspection.

4. A comprising:

(a) an antenna, (b) a receiver, configured, in combination with said antenna, to receive at least one emission of an electromagnetic energy, said at least one emission being given off by at least one electrical device without an aid from a hardwire connection, (c) at least one processor, wherein said device is configured to measure and process change or changes in a signature of said at least one electromagnetic emission and is further configured to monitor a level of degradation of the at least one electrical device.

5. A device comprising:

a housing sized to be held by a hand of a user;

an antenna disposed within said housing, a receiver disposed within said housing, said receiver configured, in combination with said antenna, to receive at least one emission of an electromagnetic energy, said at least one emission being given off by at least one electrical device, at least one processor disposed within said housing, and wherein said device is configured to measure and process change or changes in a signature of said at least one electromagnetic emission.

6. The device of claim 1, wherein said at least one processor comprises a Field Programmable Gate Array (FPGA) processor configured to conduct an initial processing of a targeted analog signal and wherein said at least one processor further comprises a general purpose processor (GPU) coupled to said FPGA processor and configured to perform higher level processing of said analog signal, said higher level processing including at least one of comparing said signal to a predetermined signature, accessing a non-volatile memory provided within said device so as to store historical records, and interfacing with a user.

7. The device of claim 6, wherein said FPGA processor is further configured to transform a digital waveform of the emitted spectrum from the at least one electrical device to a frequency domain of interest.

8. The device of claim 7, further comprising a cascade integrated comb (CIC) filter configured to decimate a frequency signal, and wherein said FPGA processor is further configured to apply Fast Fourier Transform (FFT) to said frequency signal.

9. The device of claim 7, wherein said FPGA and GPU are configured to process said frequency domain and are further configured to identify inconsistencies in said digital waveform from an anticipated waveform.

10. The device of claim 1, wherein said receiver is a radio frequency (RF) receiver configured to extract a desired target frequency from a raw signal received from said antenna.

11. The device of claim 10, wherein said at least one processor includes a Field Programmable Gate Array (FPGA) configured to convert said target frequency to a baseband frequency.

12. The device of claim 3, wherein said at least one processor is configured to extract a desired target frequency from a raw signal received from said antenna.

13. The device of claim 3, wherein said at least one processor is configured to transform a digital waveform of the emitted spectrum from the at least one electrical device to a frequency domain of interest.

* * * * *